(12) United States Patent
Ji et al.

(10) Patent No.: US 11,703,540 B2
(45) Date of Patent: Jul. 18, 2023

(54) TEST CARD AND TEST DISPLAY ADAPTER WITH SHORTER TIME FOR PRELIMINARY HEAT DISSIPATION TESTS OF HIGH-PERFORMANCE DISPLAY ADAPTERS

(71) Applicants: INVENTEC (PUDONG) TECHNOLOGY CORPORATION, Shanghai (CN); INVENTEC CORPORATION, Taipei (TW)

(72) Inventors: Yidong Ji, Shanghai (CN); Xuefeng Chen, Shanghai (CN); Pinyi Xiang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/520,214

(22) Filed: Nov. 5, 2021

(65) Prior Publication Data
US 2023/0062716 A1 Mar. 2, 2023

(30) Foreign Application Priority Data
Aug. 31, 2021 (CN) .......................... 202111016137.2

(51) Int. Cl.
*G01R 31/28* (2006.01)
*H04N 17/00* (2006.01)

(52) U.S. Cl.
CPC ..... *G01R 31/2849* (2013.01); *G01R 31/2844* (2013.01); *H04N 17/004* (2013.01)

(58) Field of Classification Search
None
See application file for complete search history.

(56) References Cited

U.S. PATENT DOCUMENTS

2015/0034627 A1* 2/2015 Wu .......................... H05B 3/26
219/541

FOREIGN PATENT DOCUMENTS

JP 2007525672 A * 9/2007 ........... G01R 1/0458

OTHER PUBLICATIONS

English Translation of JP 2007-525672 (Year: 2007).*

* cited by examiner

*Primary Examiner* — Douglas X Rodriguez
(74) *Attorney, Agent, or Firm* — Muncy, Geissler, Olds & Lowe, P.C.

(57) ABSTRACT

A test card and a test display adapter are disclosed. The test card includes an assembling plate and an electrical heat source. The electrical heat source is provided on the assembling plate. The electrical heat source includes a first heat transfer plate, a second heat transfer plate and at least one heat source element. The first heat transfer plate is stacked on the assembling plate, and the second heat transfer plate is laminated over the first heat transfer plate, with the heat source element being sandwiched between the first and second heat transfer plates. The test card and the test display adapter have a wide variety of advantages including very low cost, easy material availability, a short wait time, easy manufacturability, a long service life, easy modifiability and good interoperability.

8 Claims, 3 Drawing Sheets

TEST CARD AND TEST DISPLAY ADAPTER WITH SHORTER TIME FOR PRELIMINARY HEAT DISSIPATION TESTS OF HIGH-PERFORMANCE DISPLAY ADAPTERS

CROSS-REFERENCES TO RELATED APPLICATION

This application claims the priority of Chinese patent application number 202111016137.2, filed on Aug. 31, 2021, the entire contents of which are incorporated herein by reference.

TECHNICAL FIELD

The present invention relates to a card and a display adapter, and particularly to a test card and a test display adapter.

BACKGROUND

With the development of technology, display adapters have become essential key elements in servers, and more and more powerful display adapters continue to be introduced to the market. However, high-performance display adapters tend to suffer from high power consumption and massive heat generated during operation. For this reason, such adapters must pass a sequence of thermal performance tests before they can be put into the market. However, as the development of high-performance display adapters are rather challenging, it tends to take a long time to complete those preliminary tests.

SUMMARY OF THE INVENTION

The present invention seeks to provide a test card and a test display adapter, which allow preliminary heat dissipation tests of high-performance display adapters to be completed in a shorter time.

In one embodiment of the present invention, there is disclosed a test card including an assembling plate and an electrical heat source. The electrical heat source is provided on the assembling plate. The electrical heat source includes a first heat transfer plate, a second heat transfer plate and at least one heat source element. The first heat transfer plate is stacked on the assembling plate. The second heat transfer plate is laminated over the first heat transfer plate. The heat source element is sandwiched between the first heat transfer plate and the second heat transfer plate.

In another embodiment of the present invention, there is disclosed a test display adapter including a test card and a heat sink. The test card includes an assembling plate and an electrical heat source. The electrical heat source is provided on the assembling plate. The electrical heat source includes a first heat transfer plate, a second heat transfer plate and at least one heat source element. The first heat transfer plate is stacked on the assembling plate. The second heat transfer plate is laminated over the first heat transfer plate. The heat source element is sandwiched between the first heat transfer plate and the second heat transfer plate. The heat sink is provided on the assembling plate and is thermally coupled to the second heat transfer plate.

The test display adapter incorporating the test card according to the above embodiment is constructed from commercially available materials, and has a wide range of advantages over true display adapters, including very low cost, easy material availability, a short wait time, easy manufacturability, a long service life, easy modifiability and good interoperability.

Both the above summary and the following detailed description are exemplary and illustrative of the principles of the present invention and are intended to provide a further explanation of the scope of the invention.

1 . . . Test Display Adapter
10 . . . Test Card
20 . . . Heat Sink
22 . . . Water Inlet
24 . . . Water Outlet
30 . . . Coupling Element
32 . . . Fastener
34 . . . Elastic Member
100 . . . Assembling Plate
110 . . . First Abutment Surface
120 . . . Accommodating Recess
130 . . . Cable Management Groove
140 . . . Second Abutment Surface
150 . . . Assembling Feature
200 . . . Electrical Heat Source
210 . . . First Heat Transfer Plate
211 . . . First Groove
220 . . . Second Heat Transfer Plate
221 . . . Second Groove
230 . . . Heat Source Element
300 . . . First Temperature Sensor
400 . . . Second Temperature Sensor

DETAILED DESCRIPTION

Figure 1:
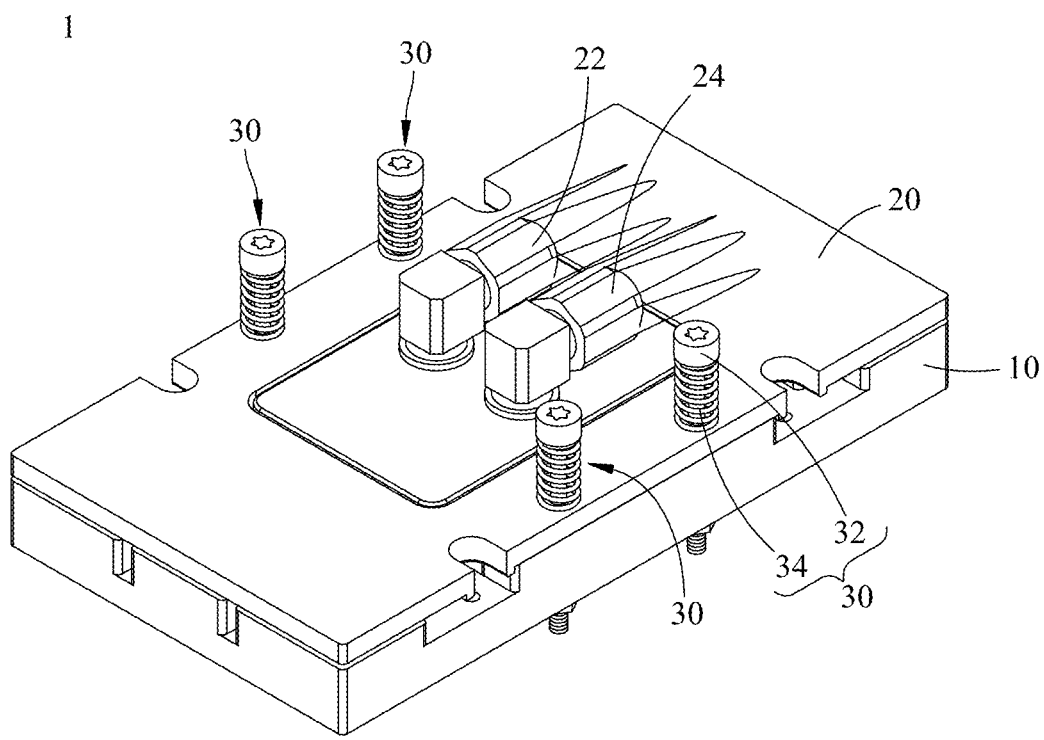
FIG. 1 shows a stereoscopic schematic representation of a test display adapter according to a first embodiment of the present invention.
Figure 2:
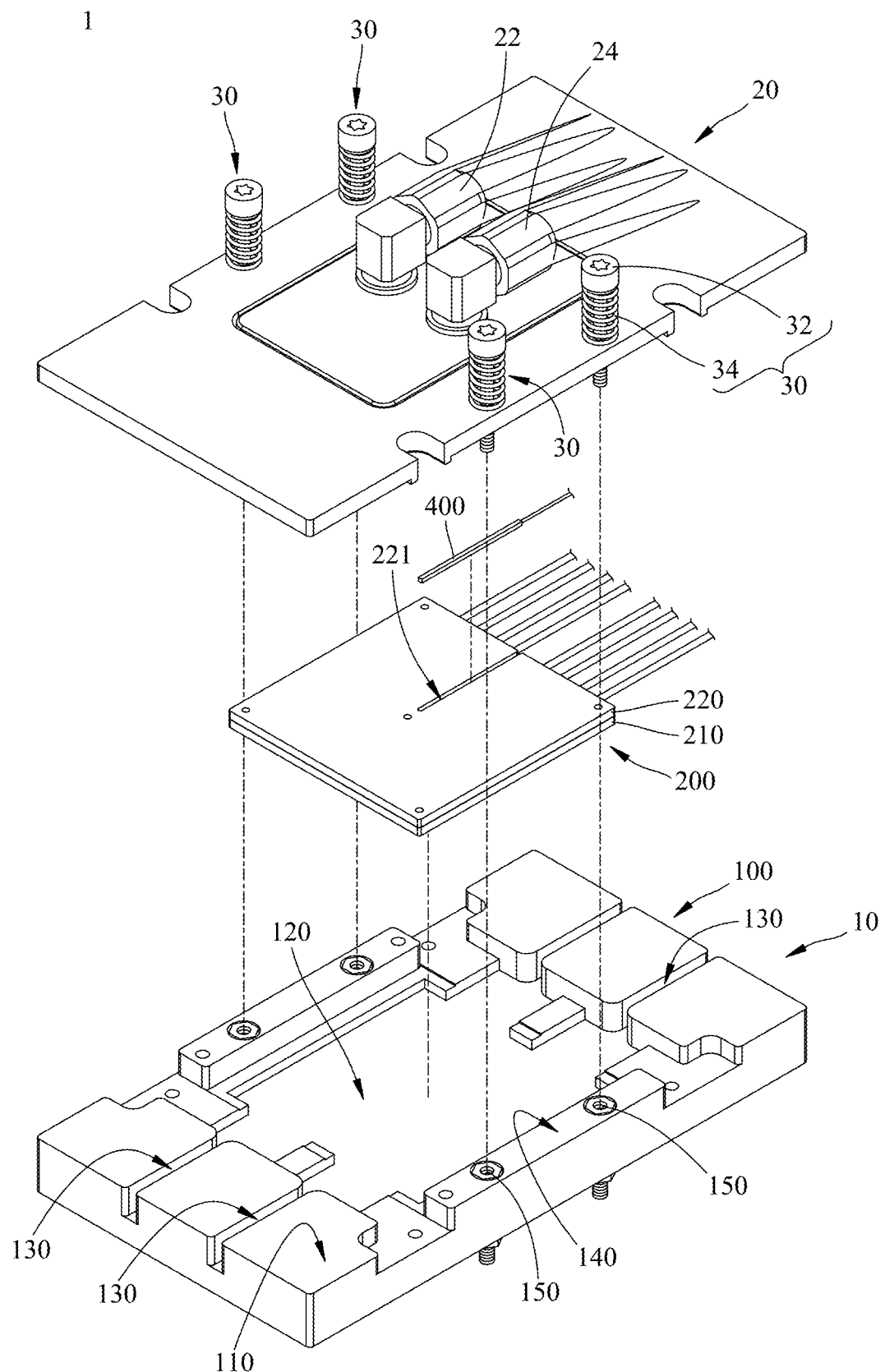
FIG. 2 is an exploded schematic diagram of FIG. 1.
Figure 3:
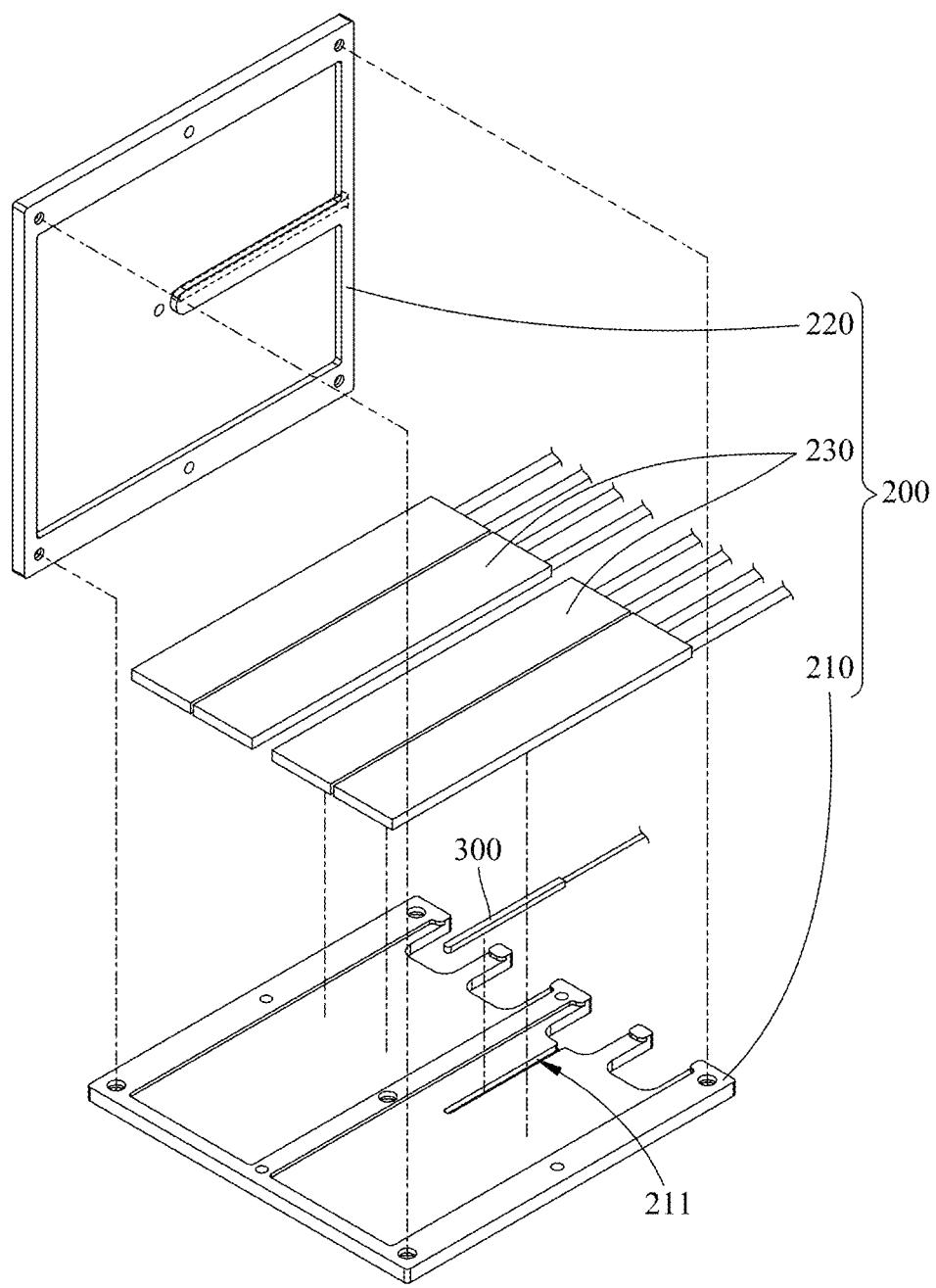
FIG. 3 is an exploded schematic diagram of an electrical heat source of FIG. 2.

Reference is made to FIGS. 1 to 3. FIG. 1 shows a stereoscopic schematic representation of a test display adapter according to a first embodiment of the present invention. FIG. 2 is an exploded schematic diagram of FIG. 1. FIG. 3 is an exploded schematic diagram of an electrical heat source 200 of FIG. 2.

The test display adapter 1 according to this embodiment includes a test card 10 and a heat sink 20. The heat sink 20 is provided on the test card 10 and is thermally coupled to the test card 10.

The test card 10 may be dimensioned similarly to, for example, a display adapter under test, and may generate heat comparable to that of the display adapter. However, in other embodiments, the test card may also be not so dimensioned.

The test card 10 includes an assembling plate 100 and an electrical heat source 200. The assembling plate 100 may be fabricated from an electrically and thermally insulating material such as a phenolic resin. The assembling plate 100 may have a first abutment surface 110, an accommodating recess 120 and multiple cable management grooves 130. Both the accommodating recess 120 and the cable management grooves 130 may be recessed from the first abutment surface 110, and the cable management grooves 130 may be provided on opposing sides of the accommodating recess 120.

Although the cable management grooves 130 have been described above in this embodiment as being provided on the opposing sides of the accommodating recess 120, the present invention is not so limited. In other embodiment, the cable management grooves may also be provided on at least one side of the accommodating recess.

In this embodiment, the assembling plate 100 may further have a second abutment surface 140 and multiple assembling features 150. The second abutment surface 140 may be offset from the first abutment surface 110. That is, the second abutment surface 140 may be not coplanar with the first abutment surface 110. The assembling features 150 may be, for example, screw holes in the second abutment surface 140.

The electrical heat source 200 is provided in the accommodating recess 120 of the assembling plate 100. The electrical heat source 200 includes a first heat transfer plate 210, a second heat transfer plate 220 and multiple heat source elements 230. The first and second heat transfer plates 210, 220 may be metal plates like copper plates, and may be assembled together, for example, via locating features and threaded locking features. The first heat transfer plate 210 is stacked on the assembling plate 100, and the second heat transfer plate 220 is laminated over the first heat transfer plate 210, thus coming into thermal contact with the heat sink 20. The heat source elements 230 may be, for example, ceramic heaters sandwiched between the first and second heat transfer plates 210, 220. The heat source elements 230 may generate heat when energized, and the wires of the heat source elements 230 may be received in the cable management grooves 130 and extend to the outside of the assembling plate 100.

In this embodiment, the multiple heat source elements 230 with dimensions available on the market, rather than a single heat source element 230, are used in combination to directly achieve the desired dimensions and amount of generated heat, as well as reduced cost, but the present invention is not so limited. In other embodiments, a single heat source element with customized dimensions and amount of generated heat may also be used.

In this embodiment, the test card 10 may further include a first temperature sensor 300 and a second temperature sensor 400. The first temperature sensor 300 may be, for example, a thermocouple disposed between the first and second heat transfer plates 210, 220. Specifically, a first groove 211 may be provided on the side of the first heat transfer plate 210 closer to the second heat transfer plate 220, and the first temperature sensor 300 may be buried in the first groove 211 to sense a temperature of the heat source elements 230 during running.

The second temperature sensor 400 may be, for example, a thermocouple disposed on the side of the second heat transfer plate 220 away from the first heat transfer plate 210. Specifically, a second groove 221 may be provided on the side of the second heat transfer plate 220 away from the first heat transfer plate 210, and the second temperature sensor 400 may be buried in the second groove 221 to sense temperature information of a surface where the second heat transfer plate 220 comes into thermal contact with the heat sink 20.

The heat sink 20 may be, for example, a water-cooling jacket provided with a water inlet 22 and a water outlet 24, which may be connected to a water-cooling radiator by separate pipes so that the water-cooling jacket and the water-cooling radiator provide a cooling circulation.

The heat sink 20 may be provided on the assembling plate 100 and thermally coupled to the second heat transfer plate 220. Specifically, the heat sink 20 may be brought into abutment against both the first abutment surface 110 and the second abutment surface 140 of the assembling plate 100 and into thermal contact with the second heat transfer plate 220. The heat sink 20 may be provided with multiple coupling elements 30 each including a fastener 32 and an elastic member 34. The elastic member 34 may be disposed over the fastener 32, while the fastener 32 may pass through the heat sink 20 and connect the assembling plate 100.

The test display adapter 1 according to this embodiment is constructed from commercially available materials, and has a wide range of advantages over true display adapters, including very low cost, easy material availability, a short wait time, easy manufacturability, a long service life, easy modifiability and good interoperability. It can be separately tested without necessarily being mounted in a server, allowing testing in advance when no complete server unit to be tested is available.

Therefore, the test display adapter incorporating the test card according to the above embodiment is constructed from commercially available materials, and has a wide range of advantages over true display adapters, including very low cost, easy material availability, a short wait time, easy manufacturability, a long service life, easy modifiability and good interoperability.

Although the present invention has been disclosed above with reference to the foregoing embodiments, it is in no way limited to thereto. Any person of ordinary skill in the art can make some changes and modifications without departing from the spirit and scope of the invention. Accordingly, the scope of the present invention is intended to be defined by the appended claims.

What is claimed is:

1. A test card, comprising:
an assembling plate; and
an electrical heat source provided on the assembling plate, the electrical heat source comprising:
   a first heat transfer plate stacked on the assembling plate;
   a second heat transfer plate laminated over the first heat transfer plate; and
   at least one heat source element sandwiched between the first heat transfer plate and the second heat transfer plate;
wherein the assembling plate has a first abutment surface, an accommodating recess and multiple cable management grooves, both the accommodating recess and the cable management grooves recessed from the first abutment surface, the multiple cable management grooves provided on at least one side of the accommodating recess, and wherein the electrical heat source is provided in the accommodating recess, and a wire of the at least one heat source element is received in at least one of the cable management grooves.

2. The test card of claim 1, wherein the multiple cable management grooves are provided on opposing sides of the accommodating recess.

3. The test card of claim 1, wherein the assembling plate has a second abutment surface and multiple assembling features, the second abutment surface configured for abutment of a heat sink thereagainst, the assembling features provided in the second abutment surface and configured for assembly of the heat sink.

4. The test card of claim 1, further comprising a first temperature sensor disposed between the first heat transfer plate and the second heat transfer plate.

5. The test card of claim 4, wherein the first heat transfer plate is provided on a side closer to the second heat transfer plate with a first groove in which the first temperature sensor is buried.

6. The test card of claim 5, further comprising a second temperature sensor disposed on a side of the second heat transfer plate away from the first heat transfer plate.

7. The test card of claim 6, wherein the second heat transfer plate is provided on a side away from the first heat transfer plate with a second groove in which the second temperature sensor is buried.

8. A test display adapter, comprising:
   a test card, comprising:
      an assembling plate; and
      an electrical heat source provided on the assembling plate, the electrical heat source comprising:
         a first heat transfer plate stacked on the assembling plate;
         a second heat transfer plate laminated over the first heat transfer plate; and
         at least one heat source element sandwiched between the first heat transfer plate and the second heat transfer plate; and
      a heat sink provided on the assembling plate and thermally coupled to the second heat transfer plate;
   wherein the assembling plate has an abutment surface and multiple assembling features, the assembling plate configured for abutment of the heat sink thereagainst, the assembling features provided in the abutment surface, the heat sink configured to be coupled to the assembling features via multiple coupling elements, and wherein the test card further comprises a first temperature sensor and a second temperature sensor, the first temperature sensor disposed between the first heat transfer plate and the second heat transfer plate, the second temperature sensor disposed on a side of the second heat transfer plate away from the first heat transfer plate.

* * * * *